United States Patent [19]

Councill et al.

[11] 4,225,947

[45] Sep. 30, 1980

[54] THREE PHASE LINE-ADDRESSABLE SERIAL-PARALLEL-SERIAL STORAGE ARRAY

[75] Inventors: Edwin D. Councill, Hopewell Junction; H. Janet Kelly, Wappingers Falls; Hua-Tung Lee, Poughkeepsie, all of N.Y.

[73] Assignee: International Business Machines Corporation, Armonk, N.Y.

[21] Appl. No.: 974,587

[22] Filed: Dec. 29, 1978

[51] Int. Cl.² .................. G11C 11/40; G11C 13/00
[52] U.S. Cl. .................................... 365/238; 365/45; 365/183; 365/189; 307/238
[58] Field of Search ............... 365/45, 183, 238, 189

[56] References Cited

U.S. PATENT DOCUMENTS

| | | | |
|---|---|---|---|
| 3,763,480 | 10/1973 | Weimer | 365/238 |
| 3,914,748 | 10/1975 | Barton et al. | 365/238 |
| 3,953,837 | 4/1976 | Cheek, Jr. | 365/238 |
| 4,011,548 | 3/1977 | Panigrahi | 365/238 |
| 4,024,512 | 5/1977 | Amelio et al. | 365/238 |
| 4,092,734 | 5/1978 | Collins et al. | 365/45 |
| 4,094,009 | 6/1978 | Schneider et al. | 365/238 |
| 4,152,780 | 5/1979 | Eberlin | 365/238 |

*Primary Examiner*—Terrell W. Fears
*Attorney, Agent, or Firm*—Theodore E. Galanthay

[57] ABSTRACT

Disclosed is an electronic data storage of the type wherein data is entered and read out serially. In a conventional serial-parallel-serial configuration, data is serially entered into an input register and then transferred and stored in parallel through the main section of the storage until data is transferred in parallel to the output register from which the data is read serially. In a conventional line-addressable configuration, data is entered into and read from columns of shift registers where each column is addressable. The disclosed array combines the conventional serial-parallel-serial and the line-addressable structures into one array. By utilizing three phase clock lines and an inhibit line for each cell, the disclosed structure can be fabricated with two levels of gate electrodes.

6 Claims, 24 Drawing Figures

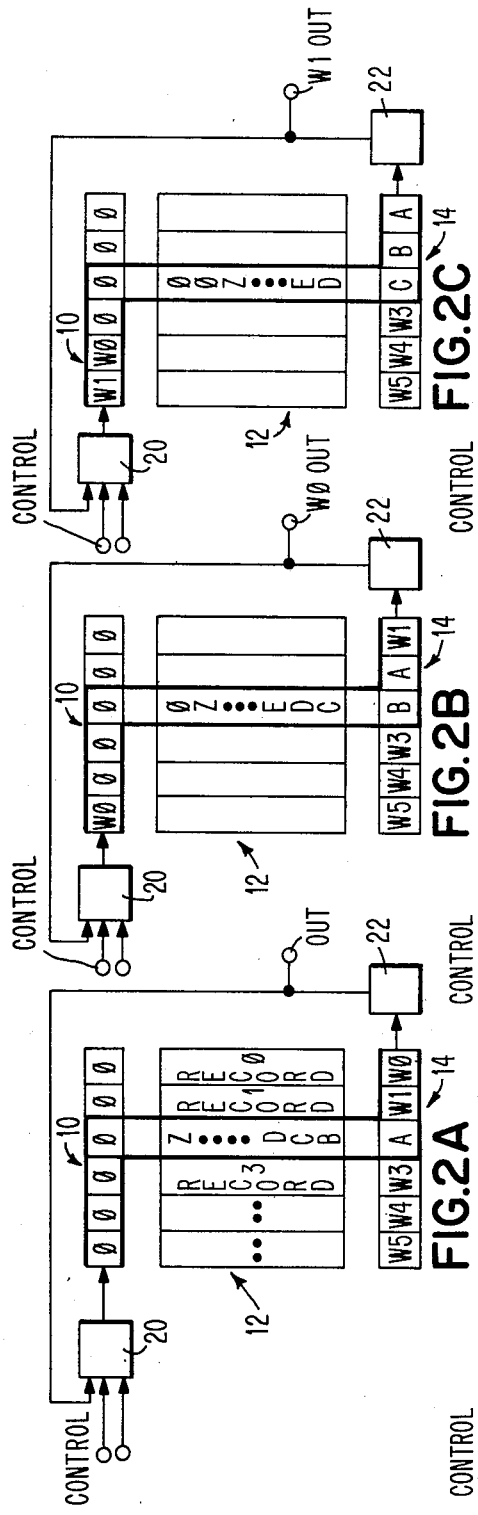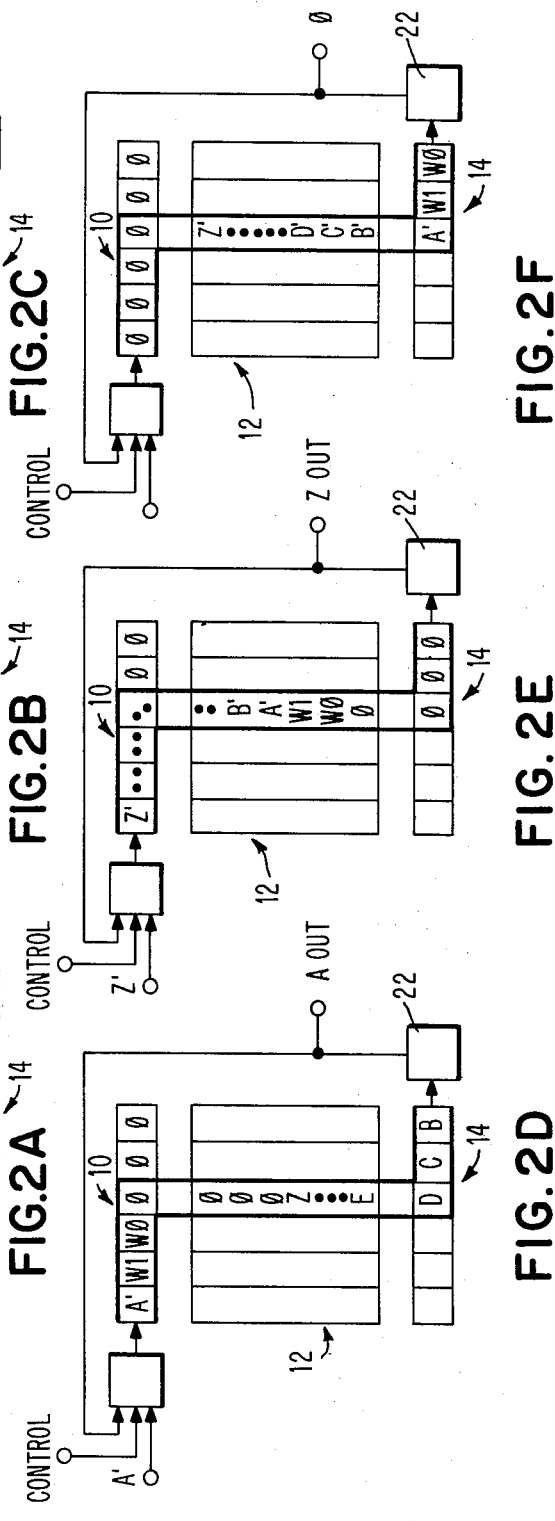

THREE PHASE LINE-ADDRESSABLE SERIAL-PARALLEL-SERIAL STORAGE ARRAY

DESCRIPTION

TECHNICAL FIELD

This invention relates to an electronic data storage array into which data is entered in a serial bit stream and extracted in a serial bit stream. More particularly, data can be extracted in a serial bit stream in more than one mode because the array of the present invention is operable both as a serial-parallel-serial (SPS) storage and a line-addressable storage (LA).

One object of the present invention is to provide an improved electronic data storage having the desirable features of a serial-parallel-serial data storage as well as those of a line-addressable data storage.

Another object of the present invention is to provide an electronic data storage fabricated from charge coupled devices.

A further object of this invention is to provide an improved electronic data storage from which serial data can be read in more than one mode.

Lastly, it is a specific object of this invention to provide an electronic data storage achieving the foregoing objectives with only two levels of gate electrodes.

CROSS REFERENCES TO RELATED PUBLICATIONS AND PATENTS

Lee, application Ser. No. 974,634 filed on (Dec. 29, 1978), the same day with the present application and entitled "Line-Addressable Serial-Parallel-Serial Array".

BACKGROUND ART

In the prior art, charge coupled devices are well known as data storage devices. The use of charge coupled devices is primarily in shift register type storage devices in which data is entered as a serial bit stream at one end of the shift register and read out as a serial bit stream at the output end of the shift register.

An important advance was the serial-parallel-serial charge coupled device shift register. Such a memory includes three essential portions. First, data is entered one bit at a time into a serial input register. Second, data is transferred in parallel from the serial input register into a parallel section. This has been referred to as one row of data in the parallel section. The parallel section typically includes many rows as this is where the bulk of the data is stored. Whereas data bits were initially inserted into the input serial register bit by bit, propagation through the parallel register is row by row. In reality, individual bits propagate along their respective channels which are customarily referred to as columns. These columns are orthogonal to the rows. Third, data is transferred out of the last row of the parallel section into the output serial register from where it is read out serially bit by bit. The output may then be transmitted to a utilization device and/or recirculated to the input of the input serial register for continuous data retention.

The foregoing generally described arrangement, aptly called serial-parallel-serial, has a number of advantages coupled with a number of inherent disadvantages. The advantages include storage density, low cost per bit of storage and reduced power consumption. A principal disadvantage, however, is that there is a long latency period because the order in which bits can be read out is always identical to the order in which bits were originally written in. Thus, if the utilization device requires data that was just written into the serial input register, the entire storage must be cycled before that information is available at the serial output register.

In order to make data more randomly accessible, conventional line-addressable storage arrays were developed. In a line-addressable array, data is inserted into and read out from a line of shift registers. For the sake of description, let these lines be in the same direction as the columns previously defined in the SPS structure. One possible implementation is that alternate columns propagate data in opposite directions resulting in continuous loops provided by each pair of columns. The line-addressable array includes many such loops operating in parallel. As the name implies, the line-addressable array has the flexibility to be read from any one of the columns or loops. Thus, the utilization device has immediate access to the desired data (zero latency). However, this greatly improved speed of operation as compared to that of a serial-parallel-serial structure is achieved at the expense of a reduced bit density and greater power consumption, resulting in a higher cost per bit.

It is thus apparent that neither the serial-parallel-serial nor the line-addressable organizations provide the optimum desired operating conditions. That is, the high bit density and low cost of the serial-parallel-serial configuration must be sacrificed in order to obtain the operating speed of a line-addressable array. As will become more apparent from the following and more detailed description of the presently disclosed invention, the advantageous aspects of a serial-parallel-serial configuration are retained while the speed of operation of a line-addressable array is also provided.

The above cross-referenced application teaches a serial-parallel-serial memory having line-addressable capabilities and operating with two phase clocks and a DC control line. The arrangement disclosed in that companion application requires three levels of gate electrodes. As will become more apparent from the following and more detailed description of the presently disclosed invention, the advantageous aspects of the companion cross-referenced application are obtained with only two levels of conductors.

BRIEF DESCRIPTION OF THE DRAWINGS

In the accompanying drawings forming the material part of this disclosure:

FIGS. 2A through 2F are diagrammatic representations of data flow when the serial-parallel-serial register is operating in a line-addressable mode.

DISCLOSURE OF INVENTION

For further comprehension of the invention, and of the objects and advantages thereof, references will be had to the following description and accompanying drawings, and to the appended claims in which the various novel features of the invention are more particularly set forth.

Figure 1:
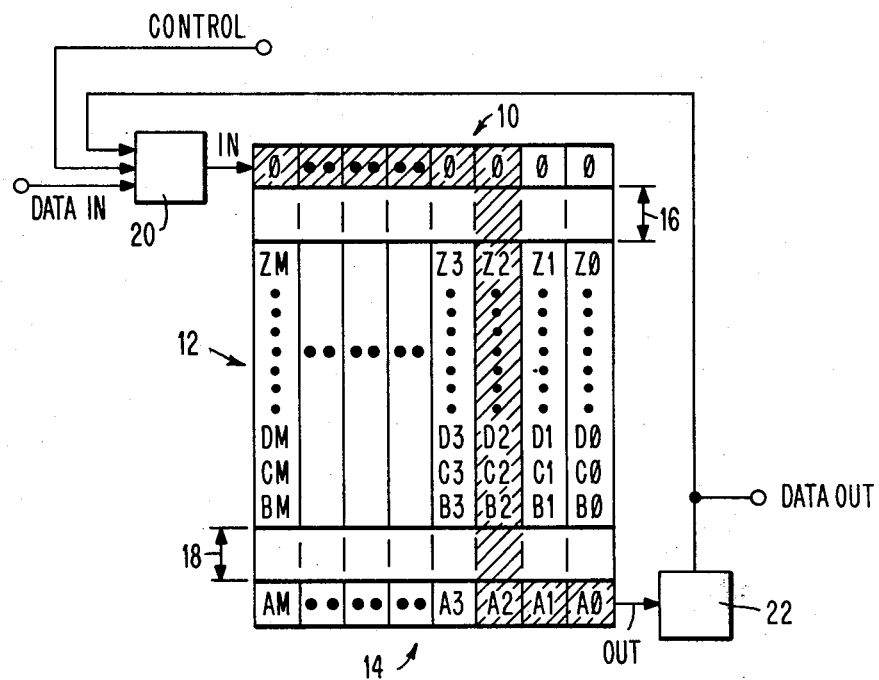
FIG. 1 is a diagrammatic representation showing a system whose quiescent state is defined with empty bits left in the input serial register.

The general conceptual aspects of the invention can be best understood by reference to FIG. 1. FIG. 1 is a schematic representation of a serial-parallel-serial (SPS) type of configuration, including an input serial register 10, a parallel central section 12, and a serial output register 14. Such arrangements frequently include a serial-to-parallel transition region 16 and a parallel-to-serial transition region 18. Gating, timing and charge launching devices for such SPS configurations are well known and are generally represented by block diagram 20. Also well known are charge detection and amplifying devices, including recirculating amplifiers, as illustrated generally by sense amplifier 22. A signal on the control input terminal determines when new data at the data in terminal or recirculated data from sense amplifier 22 is to be inputted into the first bit position in serial register 10. Even in the recirculating mode, data could be simultaneously utilized at the data out terminal.

The present invention is fully operable as a standard SPS array. In the usual and well known manner, data bits are entered serially from left to right into serial input register 10. When the desired number of bits have been entered into register 10, they are transferred in parallel through the serial-parallel transition region 16 into a first row of parallel section 12. New data then is entered into serial register 10 and, in turn, move through the serial-to-parallel transition region 16 into the first row of the parallel section 12 while the data that was previously entered into the first row of parallel section 12 is moved into the second row. In this manner, parallel section 12 is filled with data row by row. As the data first entered reaches the last row in parallel section 12, it is then transferred in parallel through the serial-to-parallel transition region 18 into the serial output register 14. At this point, data is outputted from serial register 14 one bit at a time into sense amplifier 22 and further outputted from sense amplifier 22 both to the data out terminal and to the indicated input of device 20. In the recirculating mode, data at the data out terminal is not utilized. Rather, data bits emanating from sense amplifier 22 are re-entered into serial input register 10 through device 20. Such continuous recirculation of the data bit stream prevents the loss of information in the charge coupled devices.

The intention of this invention is to recirculate data in the conventional manner of SPS structure as was described in the previous paragraph. However, a data record is to be entered and retrieved as illustrated by the shaded path of FIG. 1.

For the purpose of detailed description, the bit positions in FIG. 1 have been labeled. The arrangement includes N−1 rows in the parallel section, the first row storing the Z bits while the N−1th row storing the B bits. (M+1)×N number of bits are stored in total, as the A bits are stored in the serial output register. Each column stores a desired record consisting of data bits A through Z. The shaded cells show a serial path along which a data record is entered or retrieved.

In particular, record 2, i.e. A2 B2–Z2, is shown in its quiescent position. The data record is analagous to the line-addressable column of a conventional line-addressable structure. Note that in this example, the input register 10 has been filled with empty bits designated $\phi$. In accordance with the present invention, it is possible to read out the shaded bits in the following order: A$\phi$, A1, A2, B2 through Z2 and the $\phi$ bits as shown in the shaded portion of the register. As these bits are read out at the data out terminal, they are also recirculated through logic 20 so that at the completion of the operation the exact configuration illustrated in FIG. 1 is reestablished. At this point, it is possible either to address another record such as A3 through Z3 or, alternatively, to resume refreshing using the conventional SPS operation. Of course while any desired line is addressed, all other bits in the parallel channel remain inactive, i.e. non-propagating.

It is to be noted that there are (M+1) extra bits in the shaded parts of both input and output serial register that must be moved along with the useful record, but will be ignored by the system logic circuits.

In order to explain the present invention in still greater detail, FIGS. 2A–2F go through a complete example in detail. The FIGS. 2A–2F example utilizes the FIG. 1 embodiment in which the empty bits are in the input serial register. Structural elements corresponding to those in FIG. 1 have been numbered with corresponding reference numerals in FIGS. 2A–2F. The transition regions 16 and 18 have been intentionally omitted to simplify the illustration. Also, the nomenclature of the bits has been modified slightly for the same reason.

Referring now to FIG. 2A, assume that array record number 2 consisting of bits A, B, C, D through Z is to be the addressed line. Since this is the third array record, a counter at the output terminal in the utilization device would know that bits W$\phi$ and W1 would correspond to the first two array records and are therefore not a part of the addressed line. Thus, as shown in FIG. 2B, bit W$\phi$ is the first bit out and it is also written into the first bit position in serial input register 10 as every bit is shifted by one position. FIG. 2C illustrates the situation when every bit has been shifted one more position with W1 being read out and inserted into the first bit position in serial register 10 while all other bits are correspondingly shifted by one position. At FIG. 2D, the readout of the addressed line begins with the readout of bit A. To better illustrate the condition in which the same data is not to be recirculated, a new bit A designated A' is presented at the input terminal and placed into the first bit position of input register 10. All bits are correspondingly shifted as previously described.

This process of shifting out the desired record continues while the new bits are shifted in, until the condition illustrated in FIG. 2E is reached. Here it is seen that the last bit (Z) has been presented at the data out terminal and the new bit Z' has been inserted into the first position of input register 10. At this point, readout of data is complete although several additional cycles are required to shift the data bits back to their original position. This is illustrated in FIG. 2F in which all data bits are back in their original position and bits A', B', C', and D' through Z' have replaced their corresponding unprimed bits in FIG. 2A. In this way, a serial-parallel-serial storage array operates in a line-addressable mode where any one of the desired array records may be addressed at random. The advantages of this structure in reducing latency time is evident. By the conventional SPS mode of operation, if record Z of FIG. 1 is desired, it is necessary to wait until the whole array is accessed. However, by the discloses LA-SPS mode of operation, if any record of data is desired, the worst case latency is just M bits shifting time. For the case illustrated in FIG. 1, the latency is only the shifting time for bits A$\phi$ and A1. But additional shifting must be performed to restore the data to its original configuration to complete the operation.

Figure 3:
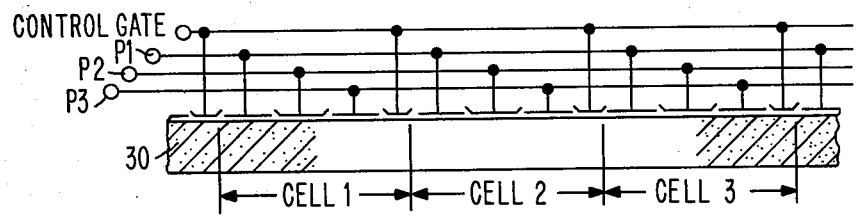
FIG. 3 is a schematic structural representation of three cells implemented in charge coupled device (CCD) technology, the cells being operated in the propagating mode.

An exemplary structural arrangement for accomplishing this function is best described in reference to the diagrammatic illustration of FIG. 3. FIG. 3 illustrates a typical P-type substrate 30. Since a three phase CCD shift register obtains its directionality from the sequence of clock phase pulses, no ion implants are needed as in the cross-referenced application. Three cells are specifically illustrated to show the arrangement of phase 1 (P1), phase 2 (P2), phase 3 (P3), and the control gate electrodes. The phase 1 and phase 3 control lines are illustrated as poly 1 while the control gate and phase 2 are shown as poly 2. Further details such as the formation of oxides and the two level arrangement of poly 1 and poly 2 are well known and described in the cross-referenced application, the teachings of which are hereby incorporated by reference.

Figure 3A:
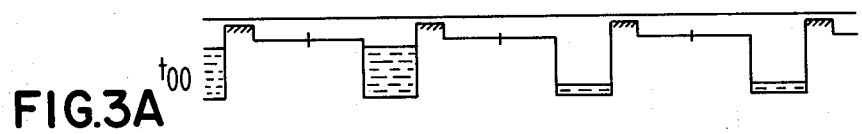
FIGS. 3A–3F are energy level diagrams representative of charge flow in the schematic structure of FIG. 3.

The operating features permitting the arrangement of FIG. 3 to operate in both a propagating and a non-propagating mode which results in the flexibility of operating both as an SPS and line-addressable array will now be described. First, the operation in the propagating mode will be described. By propagating mode is meant either the operation of each channel during SPS operation or the single channel propagating operation during line-addressable operation. FIGS. 3A–3F illustrate the energy level diagrams during the propagating mode of operation, while FIG. 3G shows the relative voltage levels required to create the illustrated energy level diagrams.

At time $t_{00}$, the control gate, phase 1 and phase 2 lines are maintained at a down level while the phase 3 line is held at an up level. The higher the up level the deeper the resultant well while more negative the down level the higher the barrier. As seen in FIG. 3A, the control gate is at the most negative potential resulting in the highest barrier while the P3 clock being at a positive potential creates a well. The phase 1 and phase 2 electrodes are held at the same down level potential which is slightly more positive than the down level potential at the control gate. In the present example, the cell immediately preceding cell 1 contains a binary 1 as does cell 1. Cells 2 and 3 contain fat zeroes.

Figure 3B:

Refer now to FIG. 3B which illustrates the energy level when the control gate electrode is brought to an up level at time $t_0$. This has created a wider potential well for containing the charge previously held under the phase 3 electrode only. It should here be noted that the control gate electrode is somewhat narrower than the other phase electrodes. This space saving is permitted because this is only a blocking electrode and does not have to hold an entire charge at any time.

Figure 3C:
Figure 3D:
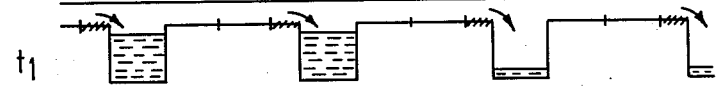

FIG. 3C shows the energy level at time $t'_1$ when the control gate electrode is brought to a down level that is not quite as negative as its starting down level at $t_{00}$, the phase 1 electrode has been brought to an up level while the phase 3 electrode is also brought to a down level. This causes charge to spill under the phase 1 electrode while having an up level potential applied thereto provides the deepest well. At time $t_1$ the aforementioned condition stabilizes with all the charge under the phase 1 electrode as illustrated in FIG. 3D.

Figure 3E:
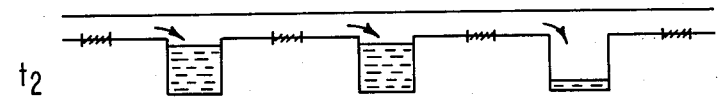

At time $t_2$, the phase 1 electrode is brought to a down level while the phase 2 electrode is brought to an up level causing the charge to be brought under the phase 2 electrode as illustrated in FIG. 3E.

Figure 3F:
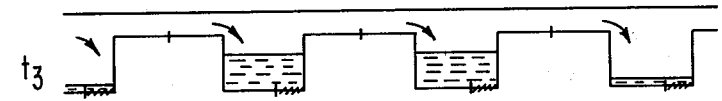
Figure 3G:
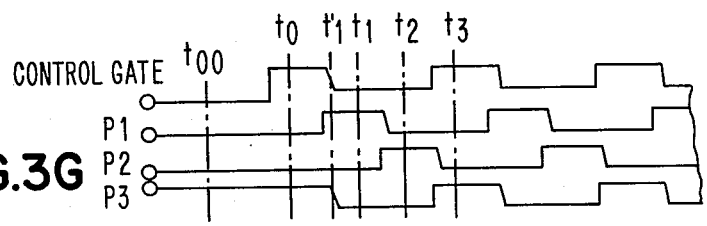
FIG. 3G is a set of waveforms illustrating the control voltage at each of the electrodes in FIG. 3.

As illustrated at time $t_3$, both the control gate and the phase 3 electrode are at an up level while the phase 1 and phase 2 clocks are at a down level. The phase 2 clock going to a down level pushes the charge therein under the phase 3 and control electrodes as illustrated in FIG. 3F. With continued reference to the timing diagram in FIG. 3G, it is seen that the next occurrence is the up level of the phase 1 electrode creating a potential well under the first electrode of cell 2. The downgoing transition of the control gate clock and the phase 3 clock push the charge previously thereunder in FIG. 3F under the phase 1 electrode of the next subsequent cell, etc. As can be seen from the foregoing, the binary 1 information as well as the fat zero information is propagated from one cell to the next in the illustrated manner.

Figure 4:
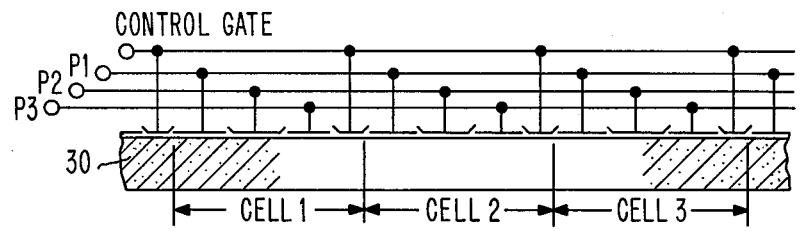
FIG. 4 is a schematic structural representation of three cells implemented in charge coupled device (CCD) technology, the cells being operated in the non-propagating mode.
Figure 4A:
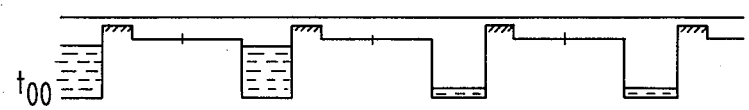
FIGS. 4A–4F are energy level diagrams representative of charge flow in the schematic structure of FIG. 4.

Refer now to FIG. 4 which shows the structure identical to FIG. 3. For this reason corresponding elements have been designated with corresponding references. As will become apparent, what is described in conjunction with FIG. 4 and FIGS. 4A–4G is the condition in the inactive channels during operation in the line-addressable mode. Thus, while the addressed channel is operating as described with respect to FIGS. 3A–3G, the remaining columns and the inactive portions of the input and the output serial registers are operating in accordance with the applied potentials at FIG. 4G and the energy level diagrams of 4A–4F.

Figure 4B:
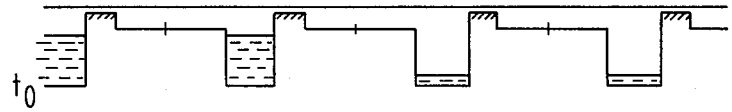
Figure 4C:
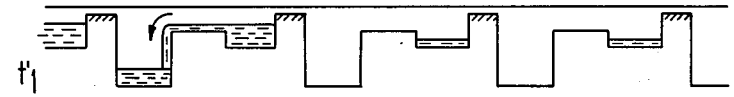
Figure 4D:
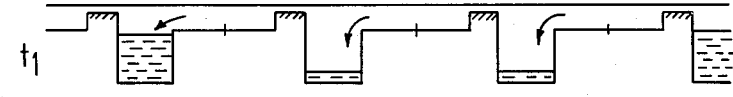

At time $t_{00}$, the phase 3 clock pulse is at an up level while all the other clock pulses are at a down level. Note that the most negative potential is that of the control gate which provides a high energy barrier which is not altered at all in the presently described mode of operation. Thus, in FIG. 4A which depicts the energy levels at time $t_{00}$, the high potential barrier is seen under each of the control electrodes. The deepest well is under the phase 3 electrode. Under the phase 3 electrode, a binary 1 is stored in cell 1 and the cell immediately preceding cell 1 while fat zeroes are stored in cell 2 and cell 3. For purposes of this example, a binary 1 is also stored in the cell subsequent to cell 3. At time $t_0$, none of the applied potentials to any of the electrodes has been altered so that the energy levels at time $t_0$ as illustrated in FIG. 4B are identical to those in FIG. 4A. At time $t'_1$, the phase 1 electrode has been brought to an up level creating a potential well thereunder and a down level condition applied to the phase 3 electrode causes binary 1 charge to spill backwards across the barrier presented by the phase 2 electrode into the well created by the phase 1 electrode. The barrier presented by the phase 2 electrode, however, is high enough to prevent the transfer of any fat zeros under the phase 1 electrodes. This condition is illustrated in the cells 2 and 3 of FIG. 4C. At time $t_1$, the downgoing transition of the phase 3 clock pulse is complete, bringing the potential levels of the phase 2 and phase 3 electrodes to the same down level, resulting in the energy level diagram of FIG. 4D. Thus, in FIG. 4D, all the binary 1 charge as well as the fat zero charge has been transferred from underneath the phase 3 electrode to underneath the phase 1 electrode within their same cells.

Figure 4E:
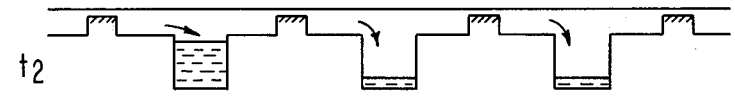

Subsequently, the phase 2 electrode is brought to an up level creating a potential well thereunder and when the phase 1 electrode is brought to a down level, the charge is transferred from under the phase 1 electrode to under the phase 2 electrode at time $t_2$ as shown in FIG. 4E. At this point in time, the phase 1 and phase 3 electrodes are at the same down level potential, keeping all the charge (either binary 1 or fat zero) under the phase 2 electrode, again within their same cells.

Figure 4F:
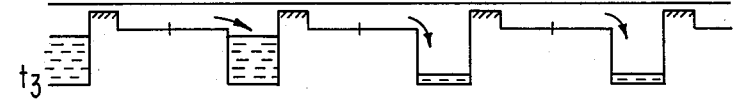

Subsequently, the phase 3 electrode is again brought to an up level creating a potential well and the phase 2 electrode is brought to a down level pushing the charge from under the phase 2 electrode into the well created by the phase 3 electrode resulting in the condition at time $t_3$ that is illustrated in FIG. 4F. Note that at this point in time, an entire cycle has been concluded and all the charge packets, including the binary 1's and the fat zeros, are back to the same positions as at time $t_{00}$. At this point, the waveforms repeat themselves for as long as it is desired to maintain the charge "stationary" in the inactive channels while a desired channel is being accessed.

Figure 4G:
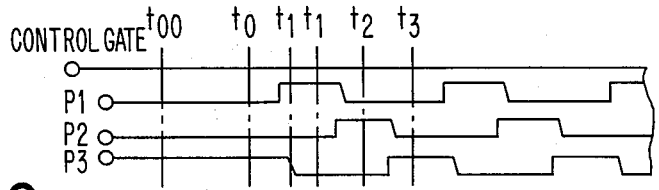
FIG. 4G is a set of waveforms illustrating the control voltage at each of the electrodes in FIG. 4.

It is noted with respect to the foregoing, that in the FIG. 4G waveform diagram the control gate electrode is always held to a down level and does not require the application of clock pulses for its operation. In the FIG. 3G waveform diagram, it is noted that the control gate and phase 3 waveforms are identical. This is accomplished by merely connecting the control gate to the phase 3 line. Again, no separate phase clock is required for the control gate. It should further be noted that the waveform diagrams P1, P2, and P3 are identical in FIGS. 3G and 4G since these waveforms are simultaneously applied to the selected channel as well as unselected channels.

Figure 5:
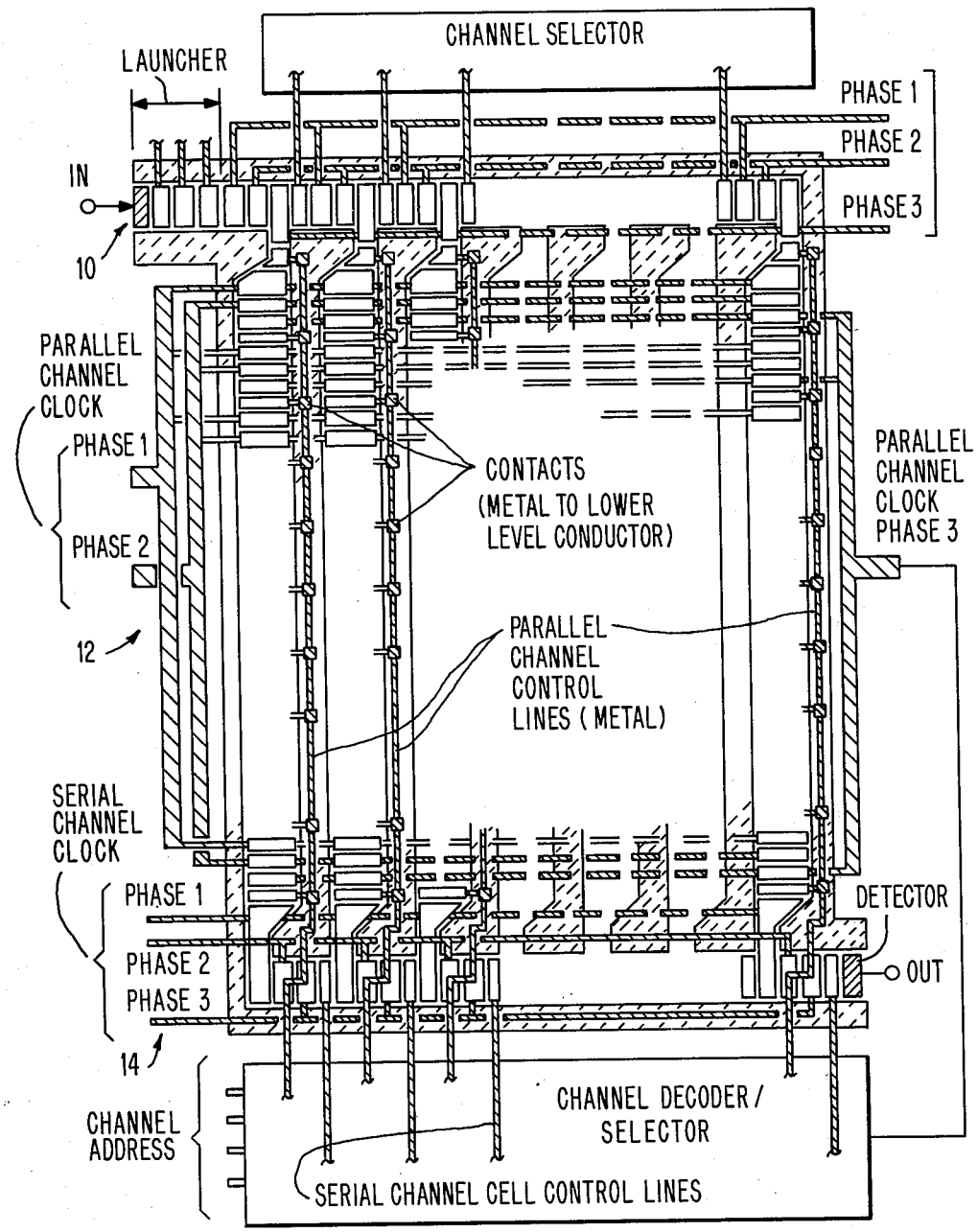
FIG. 5 is a structural diagram illustrating the horizontal topography of the serial-parallel-serial line-addressable storage of this invention.

Refer now to FIG. 5 for the description of an exemplary horizontal topography suitable for performing the SPS as well as line-addressable modes of operation that were just described. Conventional and well known operations such as transfers within a serial register, transfers within a parallel register, and serial-to-parallel and parallel-to-serial conversions, as well as the details of charge launching and detection will not be dealt with at length. These are well known to those skilled in the art.

Thus, FIG. 5 primarily shows the running of the clock and control lines. The serial input register 10, the parallel section 12, and the serial output register 14 are conventional and again numbered with reference numerals corresponding to previous drawing figures as they refer to identical structure elements. Input serial register 10 is seen receiving an input into a launcher section thereof and the connection of phase 1, phase 2 and phase 3 electrodes. Added to the conventional three phase serial input register are the inhibit lines emanating from the channel selector. These are the previously described control gate lines which must be selectively activated during the line-addressable mode of operation. There will be continuous transfer of data bits in the input serial register during an SPS mode of operation and selective transfer depending on which record is being addressed as illustrated previously, for example, in the description of FIG. 1. The cells of input serial register 10 are configured in the manner previously described with reference to FIGS. 3 and 4.

In the parallel section, each line or column of cells is also configured as previously described with references to FIGS. 3 and 4. The connection of the phase 1, phase 2 and phase 3 parallel channel clock lines is specifically shown. The timing relationships of the three phase lines in the serial and parallel sections is selected as illustrated in FIG. 3G and FIG. 4G.

Specifically note the parallel channel control lines which in this illustration are metal. These lines run along each column in the parallel channel and have metal contacts to the lower level conductor at each cell location. These contacts can be to a lower level conductor as previously described in which case a poly 1, poly 2 arrangement can be used. Thus, as previously described with respect to FIGS. 3 and 4, the phase 1 line would be poly 1, the phase 2 line would be poly 2, the phase 3 line would be poly 1 and the control gate line would again be poly 2. Thus, only two levels of gate electrode are required to provide both the propagating and non-propagating functions. The parallel channel control lines can be connected through the channel decoder/selector to the phase 3 line to provide the operation described in FIGS. 3A–3G. Alternatively, the channel decoder/selector inhibits all columns except one with a down level applied to the parallel channel control lines and only connects the selected one parallel channel control line to the phase 3 clock. In this manner, the line-addressable mode of operation is accomplished.

In the output register 14, the serial channel control lines are controlled by the channel decoder/selector in order to read data out in the three phase mode of operation. In SPS operation, data will be read in parallel from the last row in parallel section 12 into output register 14 from where it is read out one bit at a time at the output terminal through the detector. In the case of a line-addressable mode of operation, the desired number of serial channel control lines are activated in the propagating mode of operation while the remaining ones are held non-propagating. This is done in the same manner as in the parallel section as previously described in conjunction with FIGS. 3 and 4 in order to achieve the selective line-addressable mode of operation described with respect to FIGS. 1 and 2A–2F.

While we have illustrated and described the preferred embodiment of our invention, it is to be understood that we no not limit ourselves to the precise construction herein disclosed and the right is reserved to all changes and modifications coming within the scope of the invention as defined in the appended claims.

Having thus described the invention, what is claimed as new, and desired to be secured by Letters Patent is:

1. A controlled three phase line-addressable serial-parallel-serial storage array comprising:
   a serial input register for accepting data bits at an input;
   a serial output register for providing data bits at an output;
   a parallel register having a plurality of parallel columns, each said column arranged between a storage position in said input register and a storage position in said output register, for receiving data bits from said serial input register and for transferring data bits to said serial output register;
   first, second, and third phase lines connected to each said registers; and control lines connected to each said registers, each one of said control lines being adapted to selectively inhibit the propagation of data bits in said registers;

the first, second, and third phase lines connected to the parallel register being arranged in parallel to each other, and orthogonally to said columns, each said first, second and third phase lines being associated with one row of said parallel register;

the control lines connected to the parallel register being arranged in parallel to each other, and orthogonally to said first, second, and third phase lines, each said control lines extending along one of the columns of the parallel register such that a control signal applied by means of one or more of said control lines to a desired one or more of the columns selectively inhibits or permits data bit propagation from one row of said parallel register to another along said one or more columns.

2. A controlled three phase line-addressable serial-parallel-serial storage array as in claim 1, wherein:

each one of said first, second, and third phase lines are connected to corresponding ones of a plurality of gate electrodes along each row of said parallel register;

each one of said control lines being connected to a corresponding one of a plurality of control gate electrodes along each one of said columns in said parallel register;

each one of said gate electrodes being formed from a polycrystalline silicon material.

3. A controlled three phase line-addressable serial-parallel-serial storage array as in claim 2, wherein:

alternate ones of said gate electrodes are formed from first and second levels of polycrystalline silicon material.

4. A controlled three phase line-addressable serial-parallel-serial storage array as in claim 3 wherein:

the control gate electrodes associated with each said control lines are formed from the second level of polycrystalline silicon material and are adapted to be dimensioned smaller than any of the gate electrodes associated with the first, second and third phase lines.

5. A controlled three phase line-addressable serial-parallel-serial storage array as in claim 1 further comprising:

means for selectively connecting a desired one or more of said control lines to either a fixed potential or to one of said first, and third phase lines.

6. A controlled three phase line-addressable serial-parallel-serial storage array as in claim 5 wherein the control line is selectively connectable to said third phase line.

* * * * *